United States Patent
Dunn

(10) Patent No.: US 8,507,190 B2
(45) Date of Patent: Aug. 13, 2013

(54) METHOD FOR PREPARING ALIGNMENT MARK FOR MULTIPLE PATTERNING

(75) Inventor: Shannon W. Dunn, Altamont, NY (US)

(73) Assignee: Tokyo Electron Limited, Tokyo (JP)

(*) Notice: Subject to any disclaimer, the term of this patent is extended or adjusted under 35 U.S.C. 154(b) by 306 days.

(21) Appl. No.: 12/851,032

(22) Filed: Aug. 5, 2010

(65) Prior Publication Data
US 2012/0034557 A1 Feb. 9, 2012

(51) Int. Cl.
*G03F 7/26* (2006.01)

(52) U.S. Cl.
USPC .......................................................... 430/322

(58) Field of Classification Search
USPC .......................................... 430/322, 323, 325
See application file for complete search history.

(56) References Cited

U.S. PATENT DOCUMENTS

| | | | |
|---|---|---|---|
| 2007/0026543 A1* | 2/2007 | Sato | 438/10 |
| 2009/0246709 A1* | 10/2009 | Nakasugi et al. | 430/319 |
| 2010/0086878 A1* | 4/2010 | Hatakeyama et al. | 430/324 |

* cited by examiner

*Primary Examiner* — Brittany Raymond
(74) *Attorney, Agent, or Firm* — Wood, Herron & Evans, LLP

(57) ABSTRACT

A method for image pattern recognition in a multi-image patterning scheme is described. The method includes forming a first feature pattern on a substrate using a lithographic process, and forming a second feature pattern on the substrate using the lithographic process. The method further includes forming an inspection alignment mark on the substrate to distinguish the first feature pattern from the second feature pattern. The inspection alignment mark comprises a negative tone pattern having a first alignment structure aligned with at least a portion of the first feature pattern and a second alignment structure aligned with at least a portion of the second feature pattern, wherein the first alignment structure is independent from the second alignment structure.

19 Claims, 13 Drawing Sheets

METHOD FOR PREPARING ALIGNMENT MARK FOR MULTIPLE PATTERNING

BACKGROUND OF THE INVENTION

1. Field of Invention

The invention relates to a method for preparing an alignment mark on a substrate and, in particular, a method for distinguishing one feature pattern from another feature pattern in a multi-pattern structure.

2. Description of Related Art

In material processing methodologies, such as those used in the fabrication of micro-electronic devices, pattern etching is often utilized to define the intricate patterns associated with various integrated circuit elements. Pattern etching comprises applying a patterned layer of photo-sensitive material, such as photo-resist, to a thin film on an upper surface of a substrate, and transferring the pattern formed in the layer of photo-sensitive material to the underlying thin film by etching.

The patterning of the photo-sensitive material generally involves coating an upper surface of the substrate with a thin film of photo-sensitive material and then exposing the thin film of photo-sensitive material to a pattern of radiation by projecting radiation from a radiation source through a mask using, for example, a photolithography system. Thereafter, a developing process is performed, during which the removal of the irradiated regions of the photo-sensitive material occurs (as in the case of positive-tone photo-resist), or the removal of non-irradiated regions occurs (as in the case of negative-tone photo-resist). The remaining photo-sensitive material exposes the underlying substrate surface in a pattern that is ready to be etched into the surface.

Photolithography systems for performing the above-described material processing methodologies have become a mainstay of semiconductor device patterning for the last three decades, and are expected to continue in that role down to 32 nm resolution, and less. Typically, in both positive-tone and negative-tone pattern development, the minimum distance (i.e., pitch) between the center of features of patterns transferred from the mask to the substrate by a photolithography system defines the patterning resolution.

As indicated above, the patterning resolution ($r_o$) of a photolithography system determines the minimum size of devices that can be made using the system. Having a given lithographic constant $k_1$, the resolution is given by the equation $$r_0 = k_1 \lambda / NA, \quad (1)$$

where $\lambda$ is the operational wavelength of the EM radiation, and NA is the numerical aperture given by the equation $$NA = n \cdot \sin \theta_0. \quad (2)$$

Angle $\theta_o$ is the angular semi-aperture of the photo-lithography system, and n is the index of refraction of the material filling the space between the system and the substrate to be patterned.

Following equation (1), conventional methods of resolution improvement have lead to three trends in photolithography technology: (1) reduction in wavelength $\lambda$ from mercury g-line (436 nm) to the 193 nm excimer laser, and further to 157 nm and the still developing extreme-ultraviolet (EUV) wavelengths; (2) implementation of resolution enhancement techniques (RETs) such as phase-shifting masks, and off-axis illumination that have lead to a reduction in the lithographic constant $k_1$ from approximately a value of 0.6 to values approaching 0.25; and (3) increases in the numerical aperture (NA) via improvements in optical designs, manufacturing techniques, and metrology. These latter improvements have created increases in NA from approximately 0.35 to values greater than 1.35.

Immersion lithography provides another possibility for increasing the NA of an optical system, such as a photolithography system. In immersion lithography, a substrate is immersed in a high-index of refraction fluid (also referred to as an immersion medium), such that the space between a final optical element and the substrate is filled with a high-index fluid (i.e., n>1). Accordingly, immersion provides the possibility of increasing resolution by increasing the NA (see equations (1) and (2)).

However, many of these approaches, including EUV lithography, RET lithography, and immersion lithography, have added considerable cost and complexity to photolithography equipment. Furthermore, many of these approaches continue to face challenges in integration and challenges in extending their resolution limits to finer design nodes.

Therefore, another trend in photolithography technology is to utilize a double patterning approach, which has been introduced to allow the patterning of smaller features at a smaller pitch than what is currently possible with standard lithographic techniques. One approach to reduce the feature size is to use standard lithographic pattern and etch techniques on the same substrate twice, thereby forming larger patterns spaced closely together to achieve a smaller feature size than would be possible by single exposure. During double patterning, a layer of photo-sensitive material on the substrate is exposed to a first pattern, the first pattern is developed in the photo-sensitive material, the first pattern formed in the photo-sensitive material is transferred to an underlying layer using an etching process, and then this series of steps is repeated for a second pattern, while shifting the second pattern relative to the first pattern. Herein, the double patterning approach may require an excessive number of steps, including exiting the coating/developing tool and re-application of a second layer of radiation-sensitive material.

The aforementioned double patterning technique may be referred to as a Litho-Etch-Litho-Etch (LELE) technique. Other double patterning techniques, such as Litho-Litho-Etch (LLE) or Litho-Freeze-Litho-Etch (LFLE) have been developed to improve throughput by reducing the number of back-and-forth operations between photolithography and etch equipment. In the former, a single layer of photo-sensitive material is imaged twice with the first pattern and the second pattern in the photolithography system, the patterns are developed, and then the patterns are transferred into an underlying layer using etching techniques. In the latter, a first layer of photo-sensitive material is imaged and developed with a first pattern, the first pattern is chemically frozen, a second layer of photo-sensitive material is applied over the chemically frozen, patterned first layer of photo-sensitive material, the second layer of photo-sensitive material is imaged and developed with a second pattern, and then the patterns are transferred into an underlying layer using etching techniques.

Another approach to double the resolution of a lithographic pattern is to utilize a dual tone development approach, wherein a layer of photo-sensitive material on the substrate is exposed to a pattern of radiation, and then a double pattern is developed into the layer of photo-sensitive material by performing a positive-tone development and a negative-tone development. However, current dual tone development approaches lack the ability to adjust, control, and/or optimize the double pattern formed on the substrate.

As evidenced above, multi-patterning techniques, such as double patterning, have become a common technique used to push the limits of optical lithography. Although many approaches exist, the most cost effective technique is litho-litho-etch (LLE) or Litho-Freeze-Litho-Etch (LFLE). Both techniques allow formation of the double pattern on the substrate in the photolithography system prior to use of any etch equipment.

However, one issue that arises when performing double patterning of a substrate includes discernment between the first pattern (L1) and the second (L2) after full double patterning. This discrimination of patterns becomes particularly challenging within a large exposure field or array of lines/spaces (L/S). Typically, an alignment mark is placed within the field to discern between the first and second patterns, L1 and L2. Large openings within an array have been used. However, these conventional alignment marks have suffered from problems with patterning and defectivity. Therefore, an alignment mark is needed which is robust in the patterning process and is accurate in discerning the first pattern from the second pattern.

SUMMARY OF THE INVENTION

The invention relates to a method for preparing an alignment mark on a substrate and, in particular, a method for distinguishing one feature pattern from another feature pattern in a multi-pattern structure.

According to one embodiment, a method for image pattern recognition in a multi-image patterning scheme is described. The method includes forming a first feature pattern on a substrate using a lithographic process, and forming a second feature pattern on the substrate using the lithographic process. The method further includes forming an inspection alignment mark on the substrate to distinguish the first feature pattern from the second feature pattern. The inspection alignment mark comprises a negative tone pattern having a first alignment structure aligned with at least a portion of the first feature pattern and a second alignment structure aligned with at least a portion of the second feature pattern, wherein the first alignment structure independent from the second alignment structure.

According to another embodiment, an inspection alignment mark for distinguishing feature patterns in a multi-pattern structure on a substrate is described. The inspection alignment mark comprises a negative tone pattern prepared on a substrate. The negative tone pattern has a first alignment structure aligned with at least a portion of a first feature pattern on the substrate and a second alignment structure aligned with at least a portion of a second feature pattern on the substrate, wherein the first alignment structure is independent from the second alignment structure.

DETAILED DESCRIPTION OF SEVERAL EMBODIMENTS

Figure 1A:
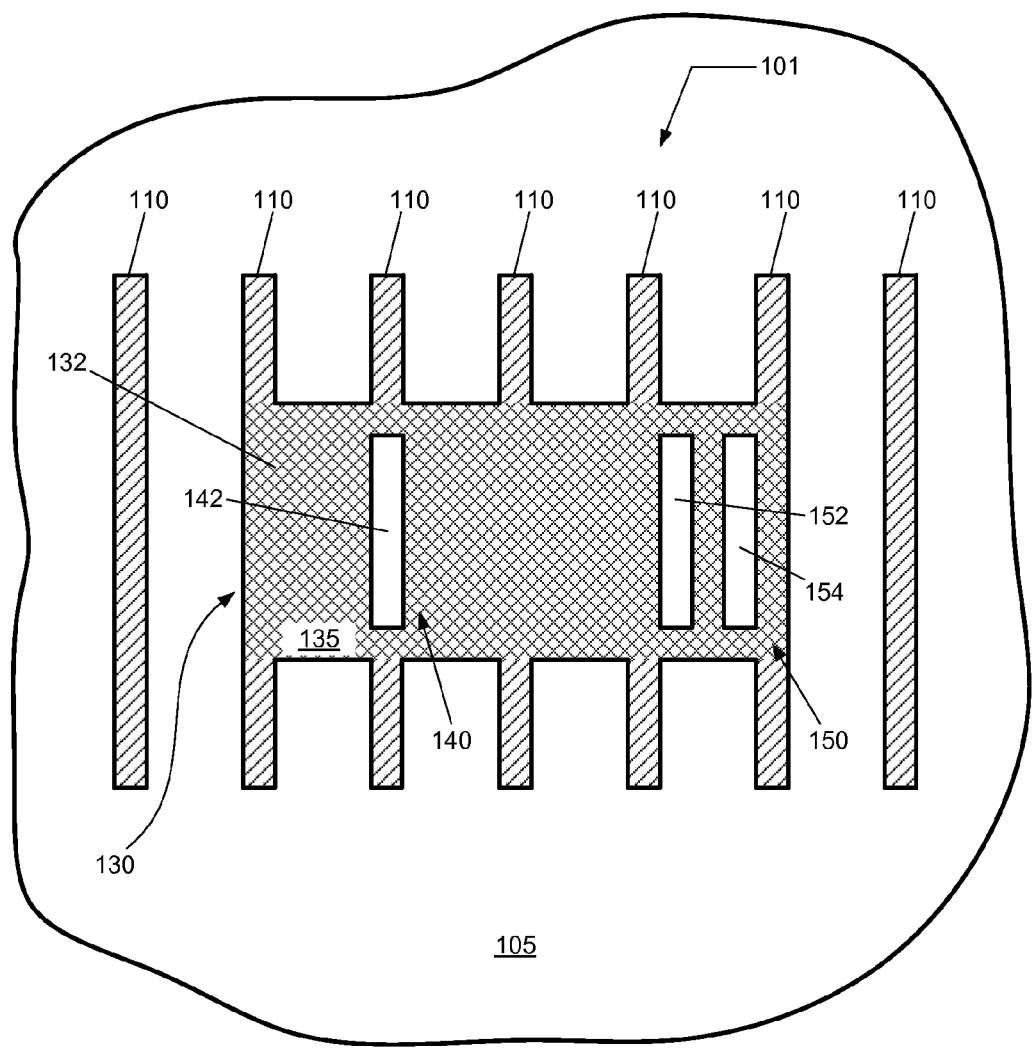
FIGS. 1A through 1E illustrate a schematic representation of a procedure for preparing an inspection alignment mark according to an embodiment.

In the following description, for purposes of explanation and not limitation, specific details are set forth, such as a particular geometry of a lithographic pattern and various lithographic processes used therein. However, it should be understood that the invention may be practiced in other embodiments that depart from these specific details.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or un-patterned, but rather, is contemplated to include any such layer or base structure, and any combination of layers and/or base structures. The description below may reference particular types of substrates, but this is for illustrative purposes only and not limitation.

In material processing methodologies, pattern etching can comprise the application of a thin layer of photo-sensitive material, such as photoresist, to an upper surface of a substrate, followed by patterning of the thin layer of material using lithographic techniques. During pattern etching, a dry plasma etching process can be utilized, wherein plasma is formed from a process gas by coupling electro-magnetic (EM) energy, such as radio frequency (RF) power, to the process gas in order to heat electrons and cause subsequent ionization and dissociation of the atomic and/or molecular constituents of the process gas. Using a series of dry etching processes, the pattern formed in the thin layer of photo-sensitive material is transferred to the underlying layers within a film stack, including the one or more material layers that are desired for the end product, e.g., an electronic device.

However, when forming multiple patterns as described above, conventional alignment marks, which include a positive tone pattern in the alignment mark prepared in a large opening within a pattern array, suffer from problems with patterning and other pattern defectivity. In more catastrophic instances, the positive tone pattern in the alignment mark may result in alignment pattern collapse or partial collapse, or may even "wash away" at least in part during developing.

Therefore, an inspection alignment mark is described in several embodiments that can eliminate one or more of these problems. The inspection alignment mark includes a negative tone pattern having a first alignment structure aligned with at least a portion of a first feature pattern and a second alignment structure aligned with at least a portion of a second feature pattern, wherein the first alignment structure is independent from the second alignment structure. For example, a negative tone pattern in the alignment mark may possess alignment structures to discern the first feature pattern (e.g., L1) and the second feature pattern (e.g., L2), and may be placed within an interior of the pattern array or along an edge of the pattern array to assist in discerning or distinguishing between the first and second feature patterns when performing SEM (scanning electron microscope) measurement work. The alignment structures that are used to discern between the first and second feature patterns may be placed in the same orientation (i.e., horizontal, or vertical) as the feature patterns in the pattern array to assist in printability of alignment marks as well as feature patterns and reduce the propensity for defectivity. Alternatively, other alignment structures may be used.

Figure 1B:
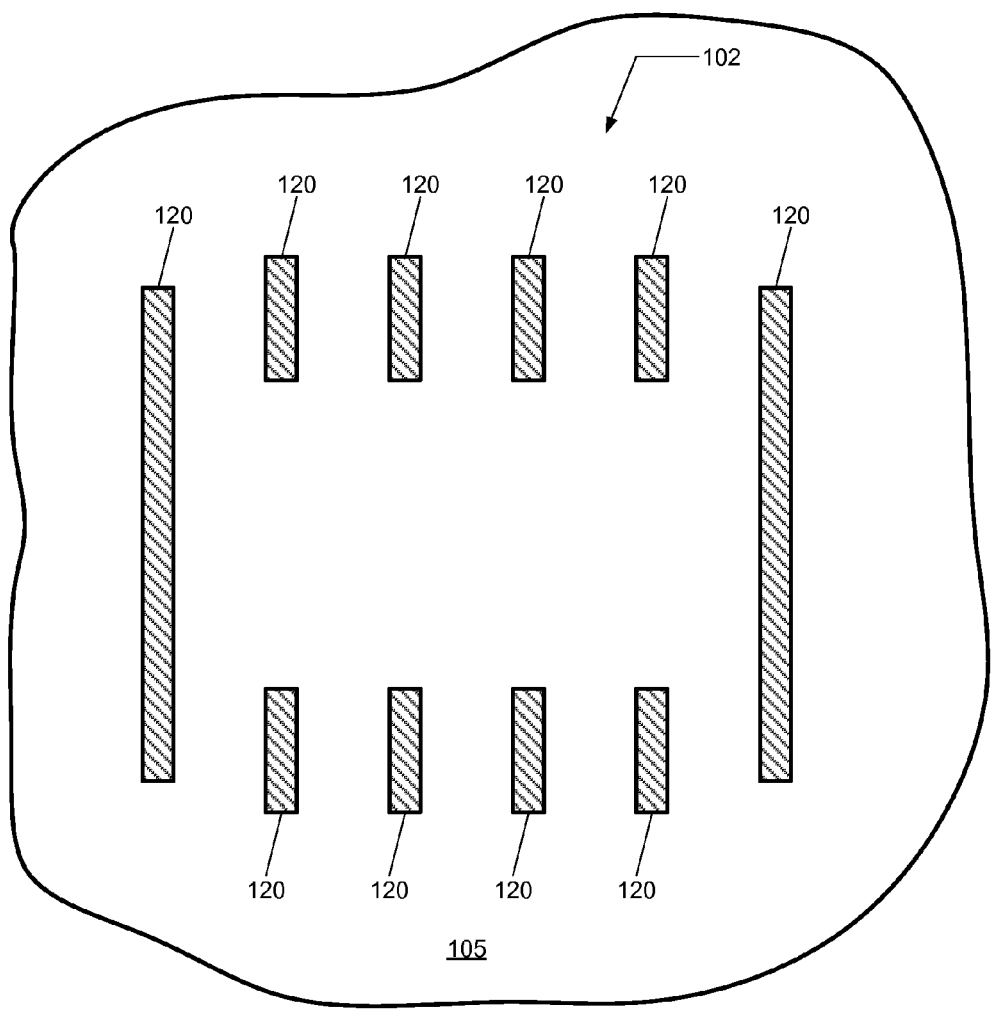
Figure 1C:
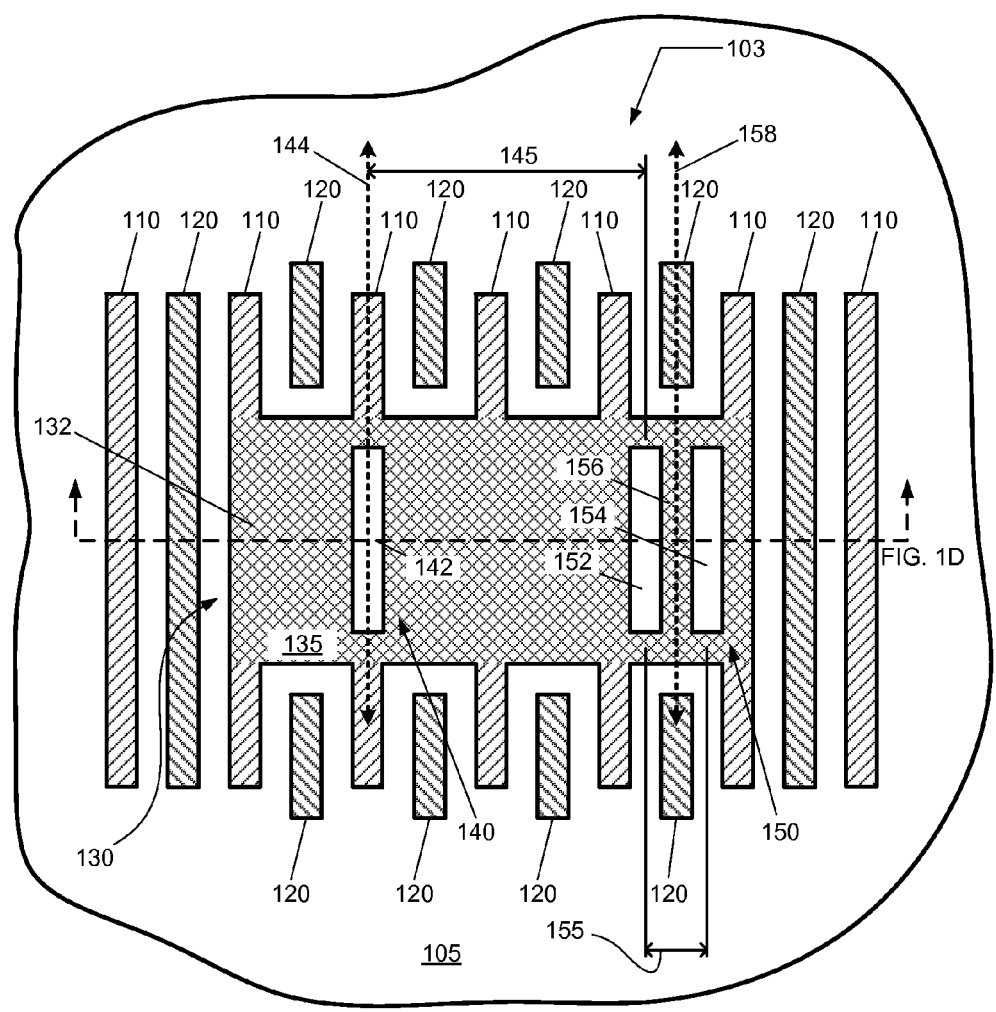
Figure 1D:
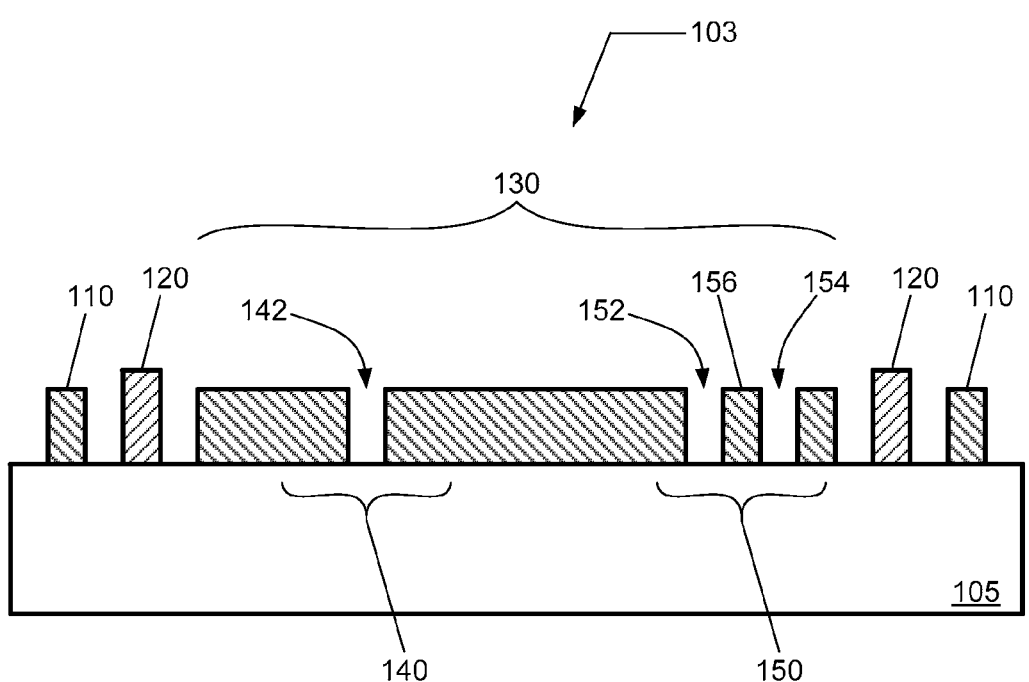
Figure 1E:
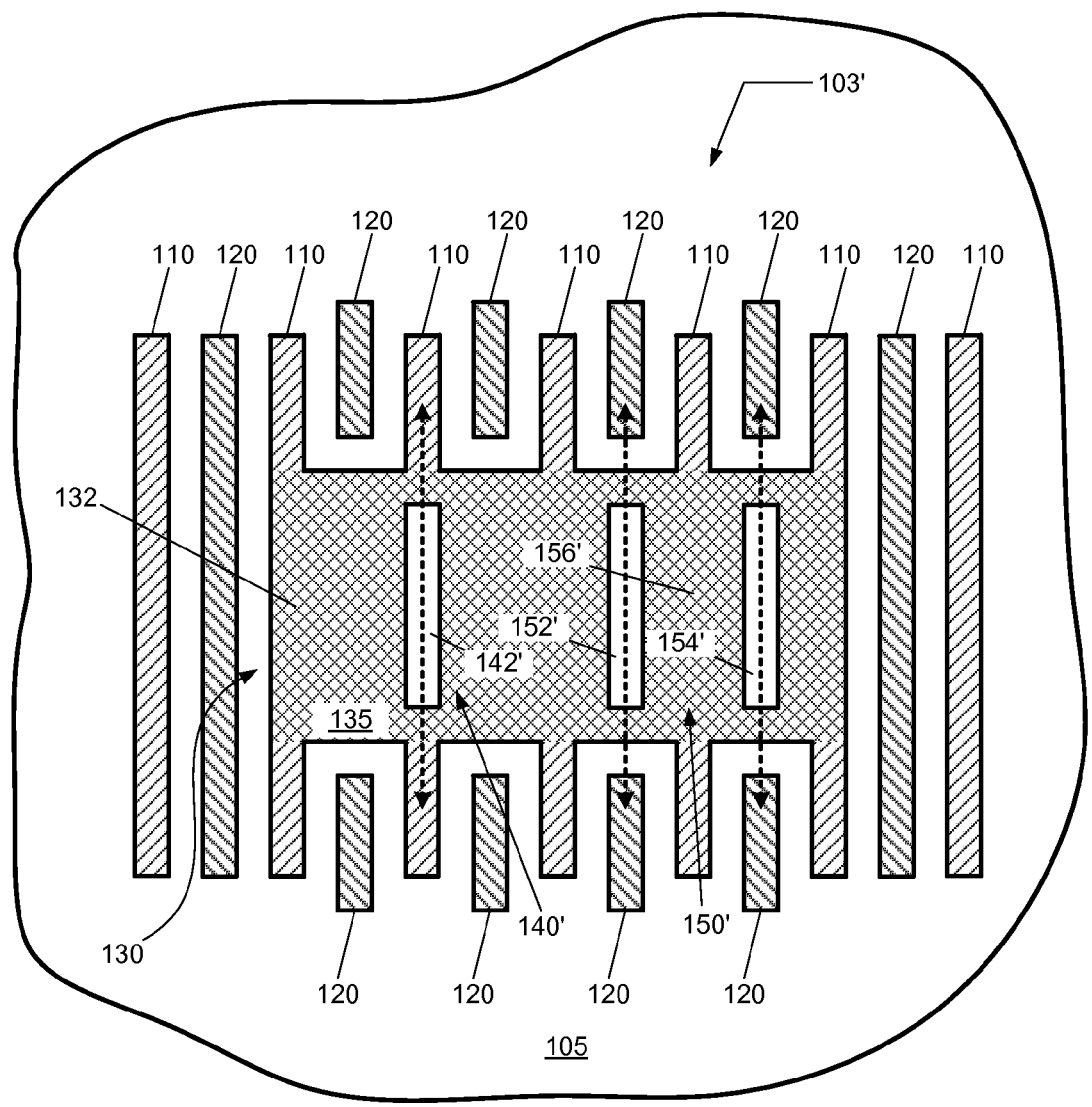
Figure 2:
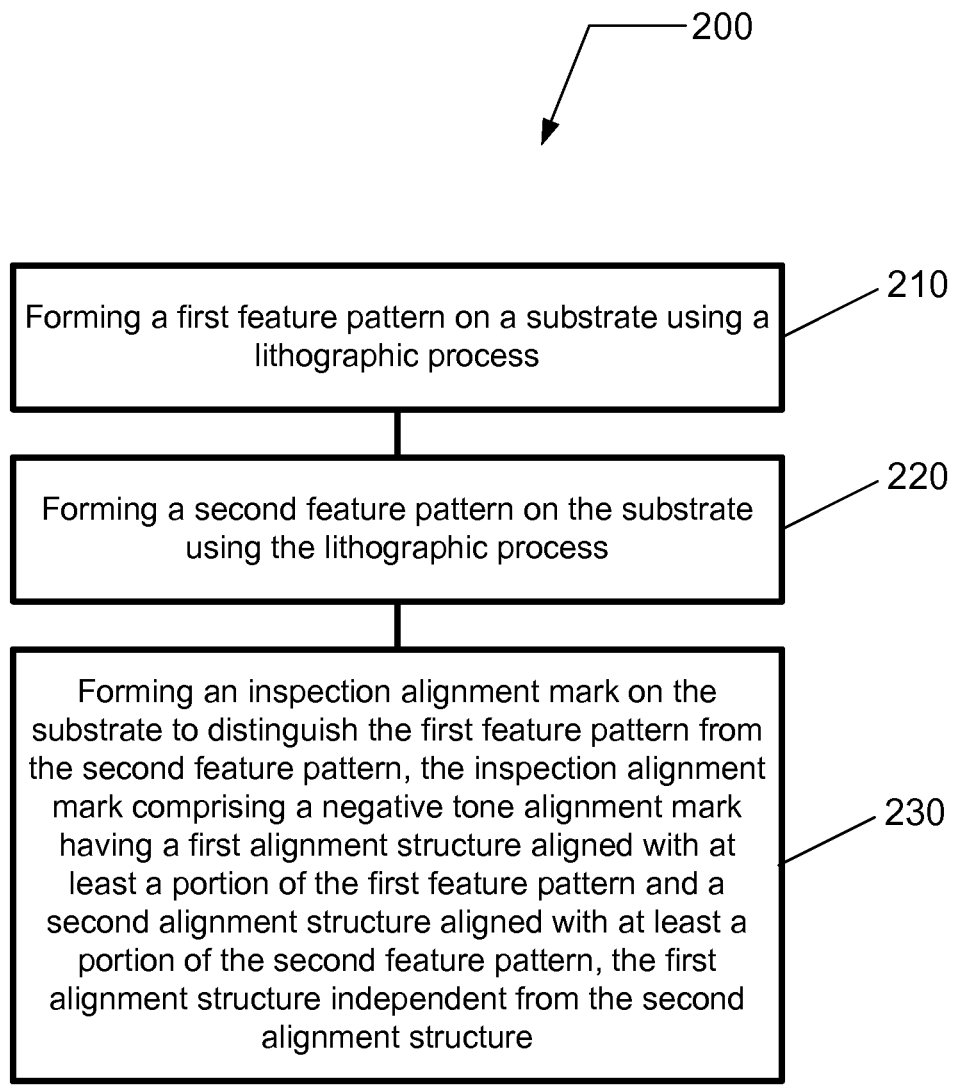
FIG. 2 provides a flow chart illustrating a method for image pattern recognition in a multi-image patterning scheme according to another embodiment.

According to an embodiment, a method of patterning a structure on a substrate is schematically illustrated in FIGS. 1A through 1D, and is illustrated in a flow chart 200 in FIG. 2. For example, the structure may include a multi-pattern lithographic structure formed in one or more layers of photo-sensitive material. The method begins in 210 with forming a first feature pattern 101 on a substrate 105 using a lithographic process. The first feature pattern 101 includes an arrangement of first feature elements 110, which may be formed in a layer of photo-sensitive material, as shown in FIG. 1A. For example, the first feature pattern 101 may include a first line pattern spaced at an equal interval or first pitch.

In 220, a second feature pattern 102 is formed on substrate 105 using the lithographic process. The second feature pattern 102 includes an arrangement of second feature elements 120, which may be formed in a layer of photo-sensitive material, as shown in FIG. 1B. For example, the second feature pattern 102 may include a second line pattern spaced at an equal interval or second pitch. Additionally, for example, the second feature pattern 102 may be arranged and spaced such that it interlaces with the first feature pattern 101 to form a double pattern 103, as shown in FIG. 1C from a top view and FIG. 1D from a cross-sectional view.

In 230, an inspection alignment mark 130 is formed on the substrate 105 to distinguish the first feature pattern 101 from the second feature pattern 102. The inspection alignment mark 130 may be formed when preparing the first feature pattern 101, as shown in FIG. 1A, or it may be formed when preparing the second feature pattern 102. Alternatively, the inspection alignment mark 130 is formed during a lithographic step separate from the steps used in preparing the first feature pattern 101 and the second feature pattern 102.

The inspection alignment mark 130 comprises a negative tone pattern 132 having a first alignment structure 140 aligned with at least a portion of the first feature pattern 101 and a second alignment structure 150 aligned with at least a portion of the second feature pattern 102, wherein the first alignment structure 140 is independent from the second alignment structure 150.

Upon formation of the double pattern 103, shown in FIG. 1C, the first alignment structure 140, the first feature pattern 101, the second alignment structure 150, and the second feature pattern 102 may be inspected using a scanning electron microscope (SEM). The first feature pattern 101 may be identified using the first alignment structure 140 in the inspection alignment mark 130, and the pattern integrity of the first feature pattern 101 may be assessed. The second feature pattern 102 may be identified using the second alignment structure 150 in the inspection alignment mark 130, and the pattern integrity of the second feature pattern 102 may be assessed.

The double pattern 103, including the first feature pattern 101, the second feature pattern 102, and the inspection alignment mark 130 formed in a layer on the substrate 105, may be transferred to an underlying layer using an etching process or series of etching processes. As will be described in greater detail below, the transfer of double pattern 103 to the underlying layer may proceed such that the first feature pattern 101 and the second feature pattern 102 are transferred separately or sequentially in time, or the transfer of double pattern 103 to the underlying layer may proceed such that the first feature pattern 101 and the second feature pattern 102 are transferred simultaneously in time.

Once the double pattern 103 is transferred to the underlying layer, the first feature pattern 101 and the second feature pattern 102 may be inspected and identified to distinguish each pattern in the underlying layer, and the pattern integrity for each pattern feature may be assessed as discussed above.

As indicated above, the inspection alignment mark 130 includes negative tone pattern 132. The negative tone pattern 132 includes a region of photo-sensitive material 135 that remains on substrate 105 following the lithographic process (cross-hatched area). The inventor has determined that a negative tone pattern provides greater robustness during the patterning of the first and second feature patterns. Among other things, the inspection alignment mark does not "wash away" during pattern development, and the negative tone pattern provides sufficient mechanical integrity to avoid pattern collapse.

When preparing the inspection alignment mark 130, the orientation, size, characteristic dimensions, and/or shape, for example, of any alignment structure, e.g., opening in the negative tone pattern 132, may be adjusted and/or optimized through adjustment to the lithographic process. For instance, one or more optical properties and/or geometric properties of the imaging mask may be altered during imaging. Further, for instance, one or more properties of the post-exposure bake (PEB) and/or developing process may be altered during developing.

The region of photo-sensitive material 135 comprises the first alignment structure 140 having one or more first openings 142 arranged in an interior of the region of photo-sensitive material 135 and the second alignment structure 150 having one or more second openings (152, 154) arranged in the interior of the region of photo-sensitive material 135. The one or more first openings 142 in the first alignment structure 140 and the one or more second openings (152, 154) in the second alignment structure 150 are identifiable from one another.

The one or more first openings 142 and the one or more second openings (152, 154) may be identifiable using any one of the following conditions: (1) the number of openings for each alignment structure; (2) the location of openings in the negative tone pattern for each alignment structure; (3) the shape of the openings in each alignment structure; (4) the orientation of the openings in each alignment structure; (5) the size of the openings in each alignment structure; (6) the size and/or location of bridges between openings in each alignment structure; or (7) any combination of distinguishing features thereof.

As shown in FIG. 1C, the double pattern 103 can include first alignment structure 140 and second alignment structure 150. For example, the first alignment structure 140 may include a single opening 142, and the second alignment structure 150 may include a pair of openings (152, 154), wherein the openings in the pair of openings (152, 154) can be separated by a bridge 156 of photo-sensitive material extending there between. The single opening 142 is spaced apart from the pair of openings (152, 154) by a distance 145 greater than the spacing 155 between the openings in the pair of openings (152, 154). In this embodiment, the single opening 142 is distinguishable from the pair of openings (152, 154) by the number of openings in each alignment structure and the location of the openings in each alignment structure in the negative tone pattern 132. For example, the single opening 142 is identifiable as a Roman numeral "I", and the pair of openings (152, 154) is identifiable as a Roman numeral "II".

Furthermore, as shown in FIG. 1C, the single opening 142 in the one or more first openings aligns with and identifies at least a portion of the first feature pattern 101. For example, the single opening aligns with at least one of the first elements 110 in the first feature pattern 101 (see first alignment 144 indicated by the dashed line with end arrows). The bridge 156 of photo-sensitive material extending between the openings in the pair of openings (152, 154) aligns with and identifies at least a portion of the second feature pattern 102. For example, the bridge 156 aligns with at least one of the second elements 120 in the second feature pattern 102 (see second alignment 158 indicated by the dashed line with end arrows).

Alternatively, as shown in FIG. 1D, a double pattern 103' is provided according to another embodiment. The region of photo-sensitive material 135 comprises a first alignment structure 140' having one or more first openings 142' arranged in an interior of the region of photo-sensitive material 135 and a second alignment structure 150' having one or more second openings (152', 154') arranged in the interior of the region of photo-sensitive material 135.

The one or more first openings comprises a single opening 142', and the one or more second openings comprises a pair of openings (152', 154'), wherein the openings in the pair of openings (152', 154') are separated by a bridge 156' of photo-sensitive material extending there between. The single opening 142' is spaced apart from the pair of openings (152', 154') by a distance 145' greater than the spacing 155' between the openings in the pair of openings (152', 154'). In this embodiment, the single opening 142' is distinguishable from the pair of openings (152', 154') by the number of openings in each alignment structure and the location of the openings in each alignment structure in the negative tone pattern 132. For example, the single opening 142' is identifiable as a Roman numeral "I", and the pair of openings (152', 154') is identifiable as a Roman numeral "II". Each of the openings in the pair of openings (152', 154') aligns with and identifies at least a portion of the second feature pattern 102. For example, each of the openings in the pair of openings (152', 154') uniquely aligns with at least one of the second elements 120 in the second feature pattern 102 (see dashed line with end arrows).

Figure 3:
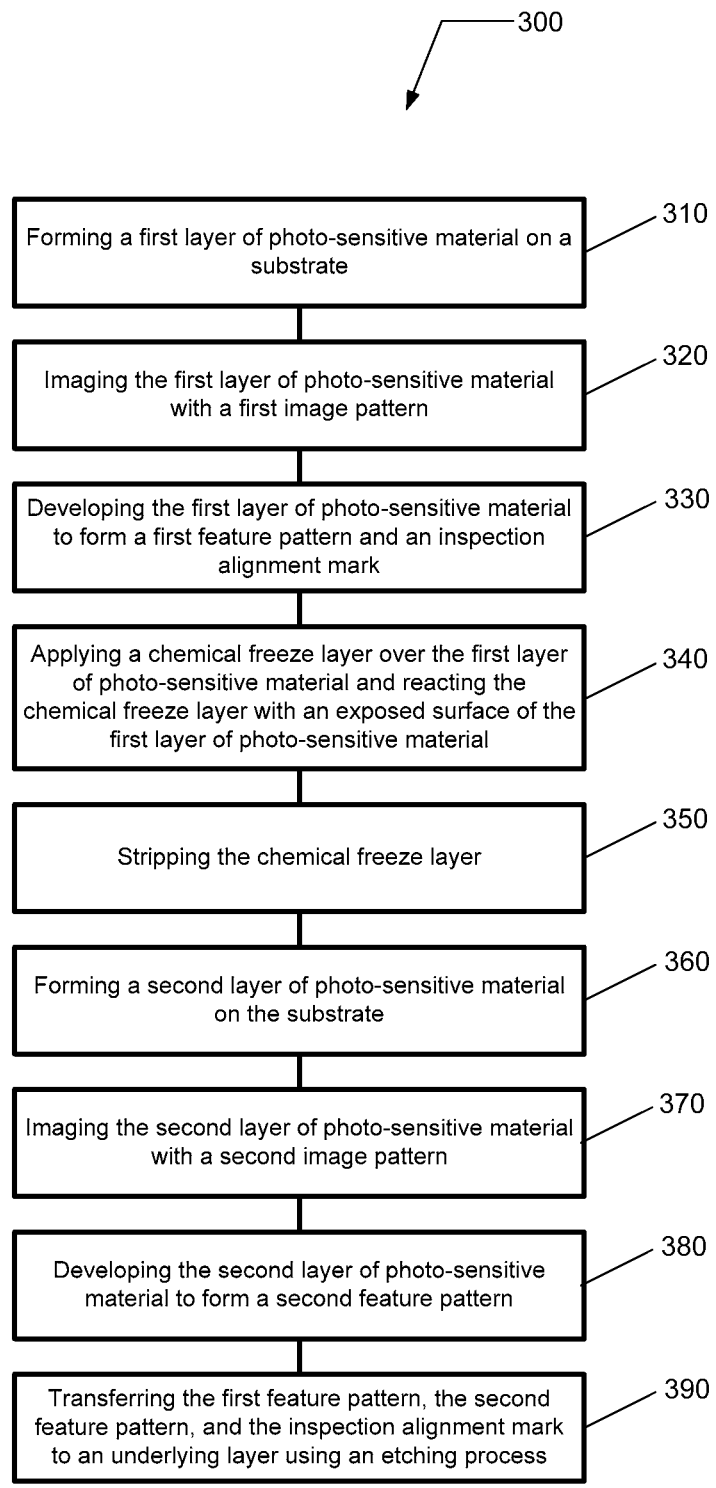
FIG. 3 provides a flow chart illustrating a lithographic process for patterning a substrate according to another embodiment.

Referring now to FIG. 3, a lithographic process for preparing a double pattern is presented according to an embodiment. The lithographic process may include a Litho-Freeze-Litho-Etch (LFLE) technique. The method includes a flow chart 300 beginning in 310 with forming a first layer of photo-sensitive material on a substrate. The first layer of photo-sensitive material may comprise photoresist. For example, the first layer of photo-sensitive material may include a 248 nm (nanometer) resist, a 193 nm resist, a 157 nm resist, an EUV (extreme ultraviolet) resist, or an electron sensitive resist. The photoresist layer may be formed using spin-on techniques. The first layer of photo-sensitive material may be formed using a track system. For example, the track system may comprise a CLEAN TRACK ACT 8, ACT 12, or LITHIUS resist coating and developing system commercially available from Tokyo Electron Limited (TEL). Other systems and methods for forming a photoresist film on a substrate are well known to those skilled in the art of spin-on resist technology. The coating of the photoresist layer may include any or all processes known to those skilled in the art of preparing such films. For example, the coating process may be preceded by a cleaning process and the coating process may be followed by one or more post-application bakes (PAB) to heat the substrate and one or more cooling cycles, following the one or more PABs, to cool the substrate.

In 320, the first layer of photo-sensitive material is imaged with a first image pattern. The exposure to patterned EM radiation is performed in a dry or wet photolithography system. The image pattern may be formed using any suitable conventional stepping lithography system, or scanning lithographic system. For example, the photolithography system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134). Alternatively, the first image pattern may be formed using an electron beam lithography system.

In 330, the first layer of photo-sensitive material is developed to form a first feature pattern on the substrate. For example, as described above, the first feature pattern may include a first line pattern. When subjected to the developing process, the first image pattern is removed while leaving behind the first feature pattern. The developing process can include exposing the substrate to a developing solution in a developing system, such as a track system. For example, the track system can comprise a CLEAN TRACK ACT 8, ACT 12, or LITHIUS resist coating and developing system commercially available from Tokyo Electron Limited (TEL). The developing process may be preceded by one or more post-exposure bakes (PEB) to heat the substrate and one or more cooling cycles, following the one or more first PEBs, to cool the substrate.

In 340, a chemical freeze layer is applied over the first layer of photo-sensitive material and the chemical freeze layer is reacted with an exposed surface of the first layer of photo-sensitive material. The chemical freeze layer may be formed by spin-coating the material onto the substrate. The chemical freeze layer may be formed using a track system. For example, the track system can comprise a CLEAN TRACK ACT 8, ACT 12, or LITHIUS resist coating and developing system commercially available from Tokyo Electron Limited (TEL). Other systems and methods for forming a photo-resist film on a substrate are well known to those skilled in the art of spin-on resist technology. The coating process may be followed by one or more bake processes to heat substrate and cure at least a portion of the chemical freeze layer.

As a result of applying the chemical freeze layer to the substrate and heating the substrate, a portion of the chemical freeze layer reacts with the exposed surface of the first layer of photo-sensitive material to form a protective layer. The protective layer protects the first layer of photo-sensitive material from subsequent coating, exposing, and developing processes, hence, "freezing" the first layer of photo-sensitive material to form the frozen first layer of radiation-sensitive material.

The chemical freeze layer may include any removable material that may cause cross-linking in a layer of photo-sensitive material. The chemical freeze layer may include a polymeric material. For example, the chemical freeze layer may include a freeze material commercially available from JSR Micro, Inc. (1280 North Mathilda Avenue, Sunnyvale, Calif. 94089), including, for example, F112 freeze material. Alternatively, for example, the chemical freeze layer may include a freeze material commercially available from Rohm and Haas, a wholly owned subsidiary of Dow Chemical Company (100 Independence Mall West, Philadelphia, Pa. 19106), including, for example, SC™ 1000 Surface Curing Agents (SCA).

In 350, the chemical freeze layer is stripped from the substrate using a strip solution to preserve the first feature pattern in the frozen first layer of photo-sensitive material. The strip solution contains an active solute and may comprise an aqueous alkali solution. Additionally, the strip solution may contain a hydroxide. Additionally, the strip solution may contain a quaternary ammonium hydroxide. Furthermore, the strip solution may include tetramethyl ammonium hydroxide (TMAH).

In 360, a second layer of photo-sensitive material is formed on the substrate. In 370, the second layer of photo-sensitive material is imaged with a second image pattern and, in 380, the second layer of photo-sensitive material is developed to form a second feature pattern on the substrate. For example, as described above, the second feature pattern may include a second line pattern interlaced with the first line pattern. When subjected to the developing process, the second image pattern is removed while leaving behind the second feature pattern.

The inspection alignment mark may be formed when imaging the first layer of photo-sensitive material with the first image pattern and developing the first layer of photo-sensitive material to leave behind the first feature pattern. Alternatively, the inspection alignment mark may be formed when imaging the second layer of photo-sensitive material with the second image pattern and developing the second layer of photo-sensitive material to leave behind the second feature pattern.

In 390, the double pattern, including the first feature pattern and the second feature pattern, and the inspection alignment mark may be transferred to an underlying layer using an etching process. The etching process may include a dry etching process or a wet etching process. The etching process may include a dry plasma etching process or dry non-plasma etching process. The underlying layer may include an anti-reflective coating (ARC) layer, a planarization layer, an organic planarization layer, an organic dielectric layer, an insulation layer, a conductive layer, a semi-conductive layer, a low dielectric constant (low-k) dielectric layer, an ultra-low-k (ULK) dielectric layer, a high dielectric constant (high-k) dielectric layer, a silicon-containing layer, or a metal-containing layer, or any combination of two or more thereof.

Figure 4:
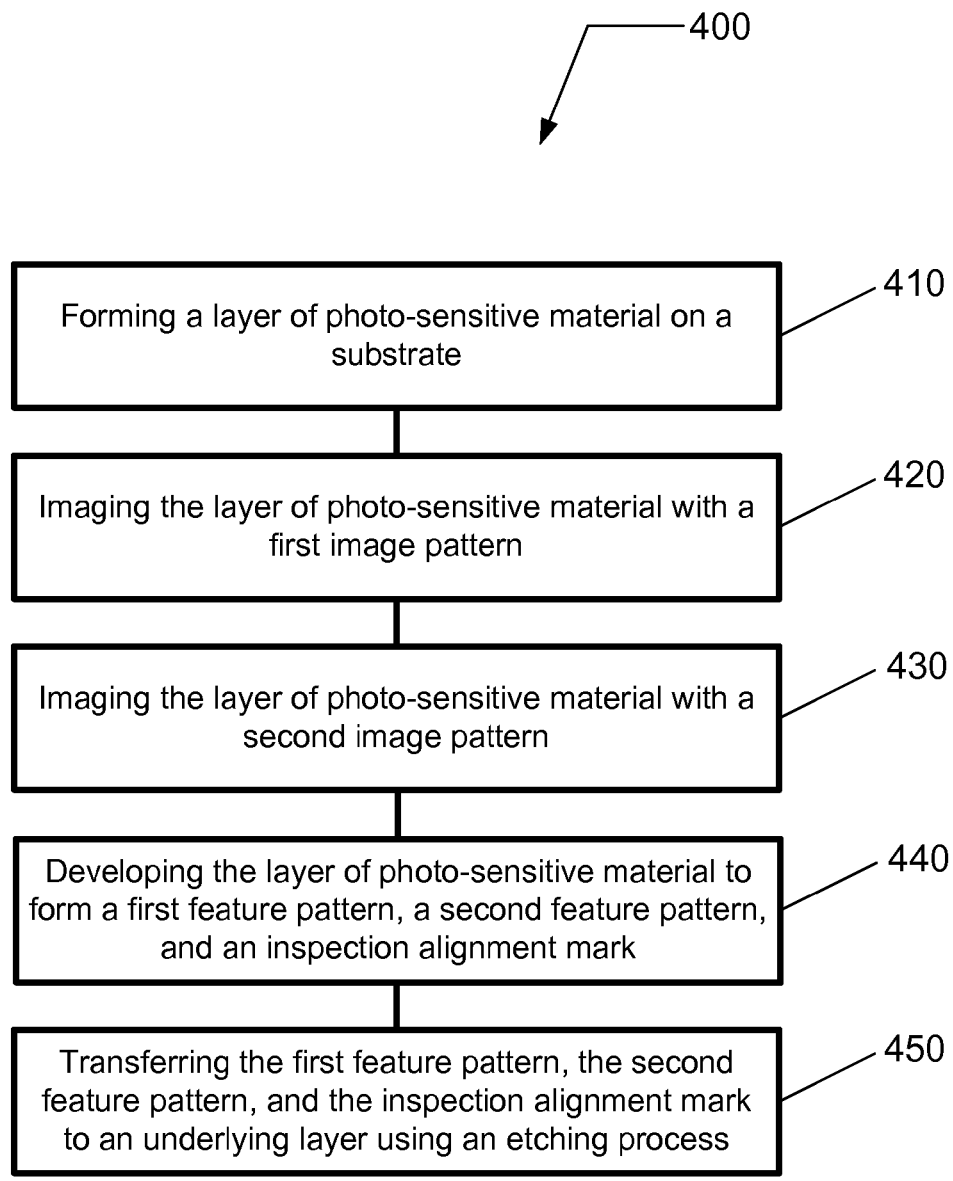
FIG. 4 provides a flow chart illustrating a lithographic process for patterning a substrate according to another embodiment.

Referring now to FIG. 4, a lithographic process for preparing a double pattern is presented according to another embodiment. The lithographic process may include a Litho-Litho-Etch (LLE) technique. The method includes a flow chart 400 beginning in 410 with forming a layer of photo-sensitive material on a substrate.

In 420, the layer of photo-sensitive material is imaged with a first image pattern. In 430, the layer of photo-sensitive material is imaged with a second image pattern and, in 440, the layer of photo-sensitive material is developed to form a first feature pattern and a second feature pattern on the substrate. For example, the first feature pattern may include a first line pattern and the second feature pattern may include a second line pattern interlaced with the first line pattern. When subjected to the developing process, the first and second image patterns are removed while leaving behind the first and second feature patterns.

The inspection alignment mark may be formed when imaging the layer of photo-sensitive material with the first image pattern. Alternatively, the inspection alignment mark may be formed when imaging the layer of photo-sensitive material with the second image pattern.

In 450, the double pattern, including the first feature pattern and the second feature pattern, and the inspection alignment mark may be transferred to an underlying layer using an etching process.

Figure 5:
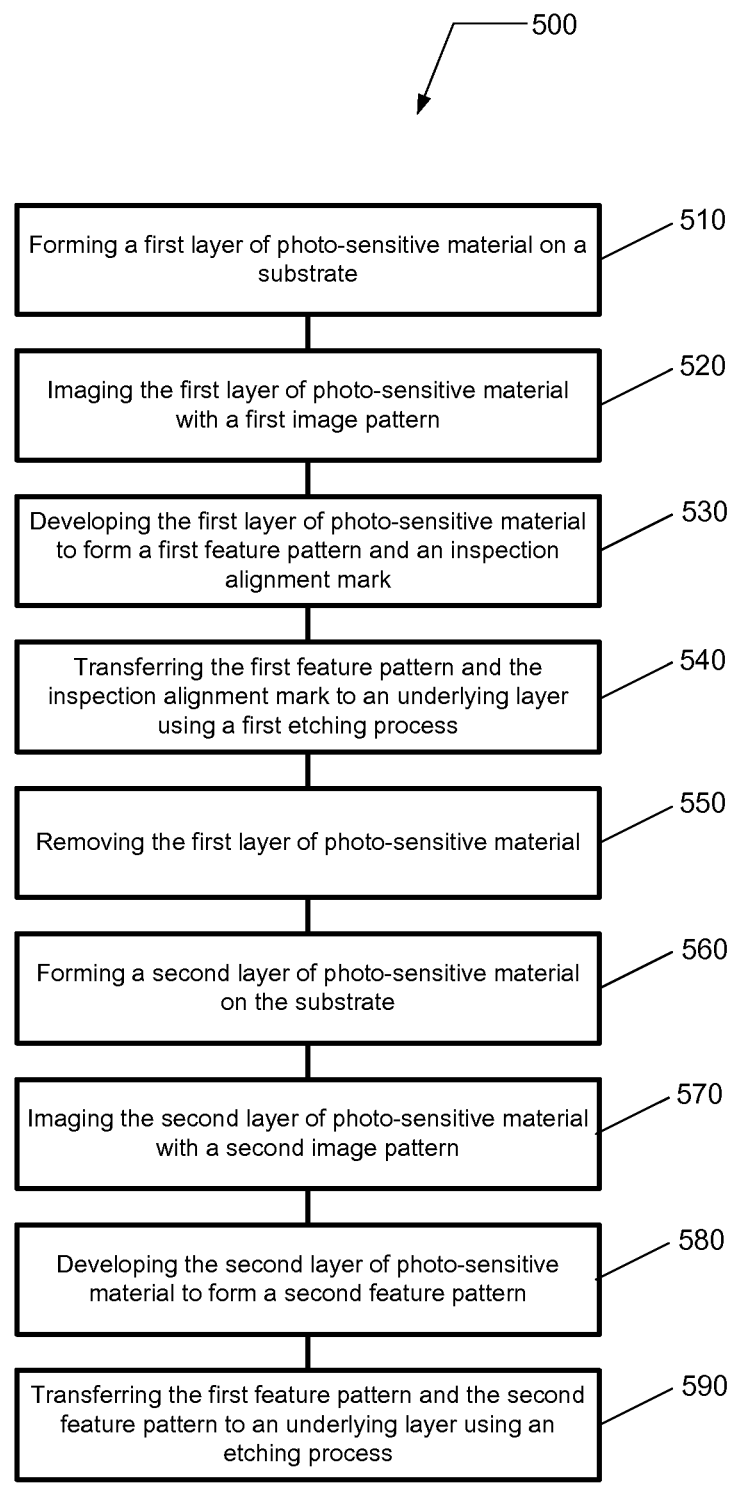
FIG. 5 provides a flow chart illustrating a lithographic process for patterning a substrate according to another embodiment.

Referring now to FIG. 5, a lithographic process for preparing a double pattern is presented according to yet another embodiment. The lithographic process may include a Litho-Etch-Litho-Etch (LELE) technique. The method includes a flow chart 500 beginning in 510 with forming a first layer of photo-sensitive material on a substrate.

In 520, the first layer of photo-sensitive material is imaged with a first image pattern. In 530, the first layer of photo-sensitive material is developed to form a first feature pattern on the substrate and, in 540, the first feature pattern is transferred to an underlying layer using a first etching process.

In 550, the first layer of photo-sensitive material is removed. The first layer of photo-sensitive material may be removed using a wet or dry stripping/ashing process.

In 560, a second layer of photo-sensitive material is formed on the substrate. In 570, the second layer of photo-sensitive material is imaged with a second image pattern. In 580, the second layer of photo-sensitive material is developed to form a second feature pattern on the substrate and, in 590, the second feature pattern is transferred to the underlying layer using a second etching process.

The inspection alignment mark may be formed when imaging the first layer of photo-sensitive material with the first image pattern and developing the first layer of photo-sensitive material to leave behind the first feature pattern. Alternatively, the inspection alignment mark may be formed when imaging the second layer of photo-sensitive material with the second image pattern and developing the second layer of photo-sensitive material to leave behind the second feature pattern.

As described above, the first alignment structure and the second alignment structure are identifiable using various techniques including, but not limited to, number, shape, size, location, orientation, etc. FIGS. 6A through 6D provide an illustration of several embodiments for identifying alignment structures and aligning the alignment structures with different feature patterns in the multi-pattern.

Figure 6A:
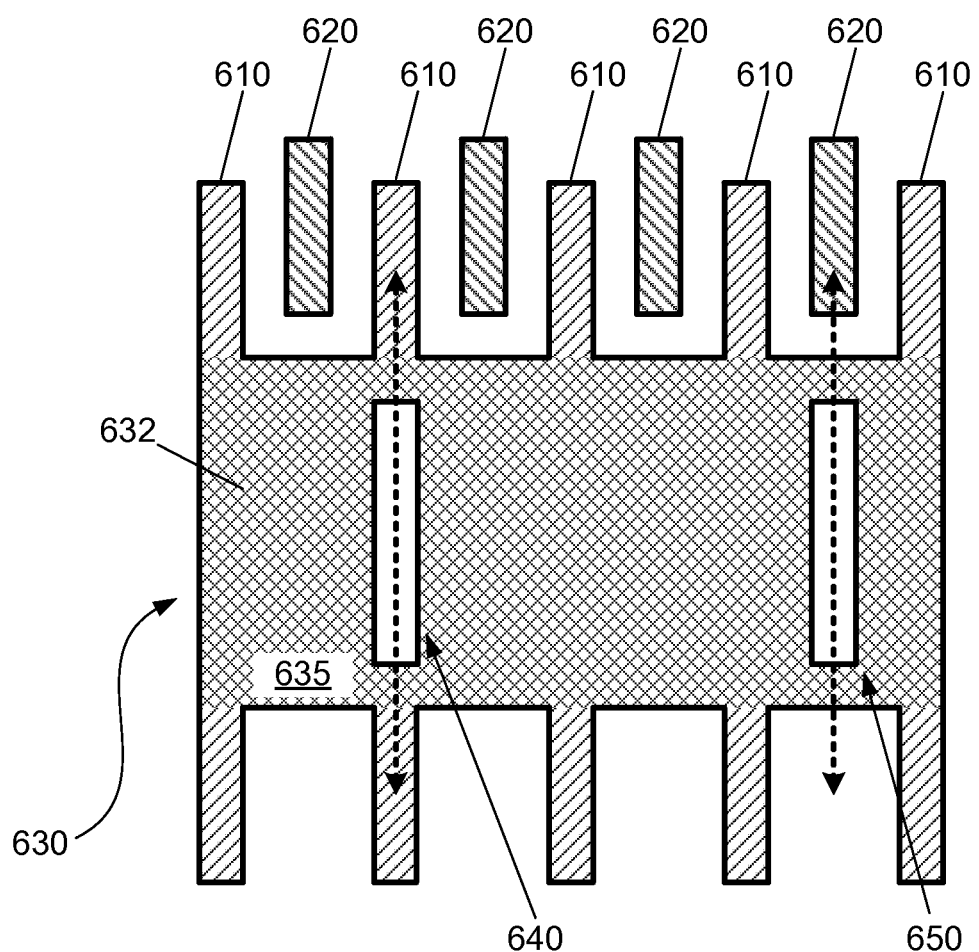
FIGS. 6A through 6D illustrate a schematic representation of an inspection alignment mark according to several embodiments.

As shown in FIG. 6A, a double pattern is provided including an arrangement of first feature elements 610, an arrangement of second feature elements 620, and an inspection alignment mark 630. The inspection alignment mark 630 comprises a negative tone pattern characterized by a region of photo-sensitive material 635 (cross-hatched area), remaining after the formation of the double pattern, that has a first alignment structure 640 and a second alignment structure 650 formed in its interior.

The first alignment structure 640 includes a rectangular opening having a longitudinal axis (dashed line with end arrows) aligned with and parallel to at least one element in the arrangement of first feature elements 610. The second alignment structure 650 includes a rectangular opening having a longitudinal axis (dashed line with end arrows) aligned with and parallel to at least one element in the arrangement of second feature elements 620. The first and second alignment marks (640, 650) may be identifiable by their location in the region of photo-sensitive material 635, i.e., the first alignment structure 640 is located on the left-hand side of the region of photo-sensitive material 635 and the second alignment structure 650 is located on the right-hand side of the region of photo-sensitive material 635.

Figure 6B:
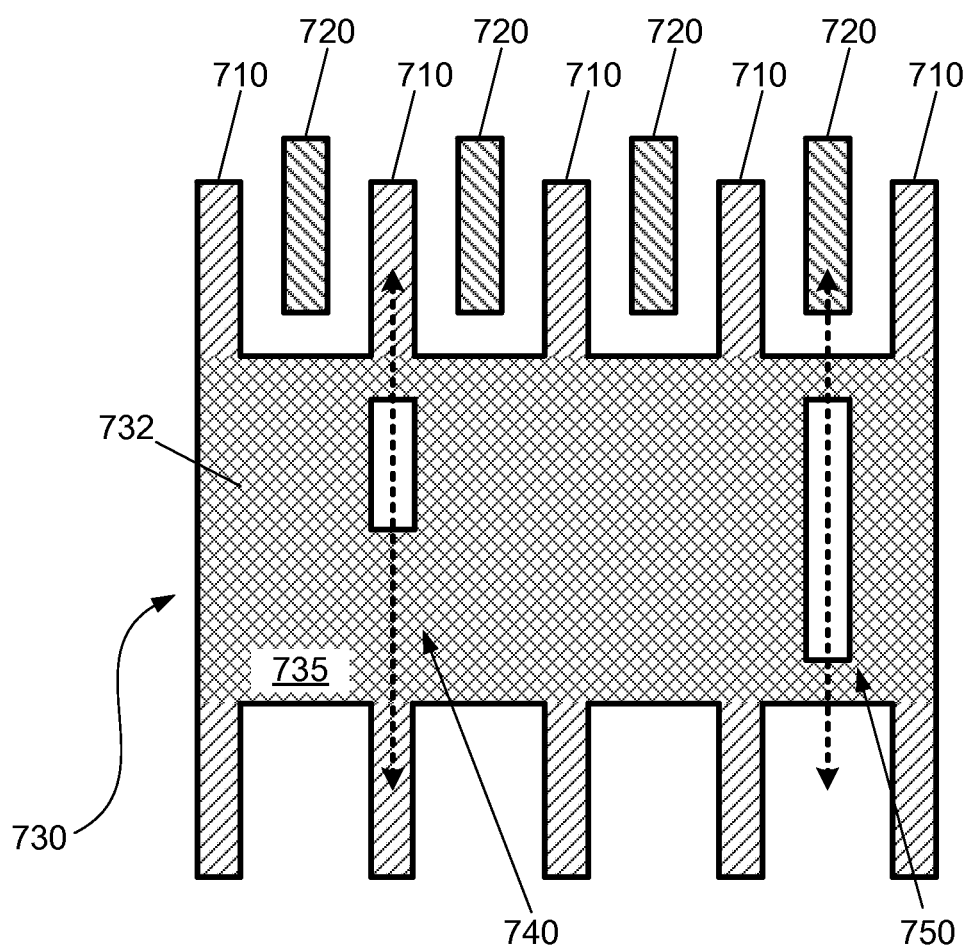

As shown in FIG. 6B, a double pattern is provided including an arrangement of first feature elements 710, an arrangement of second feature elements 720, and an inspection alignment mark 730. The inspection alignment mark 730 comprises a negative tone pattern characterized by a region of photo-sensitive material 735 (cross-hatched area), remaining after the formation of the double pattern, that has a first alignment structure 740 and a second alignment structure 750 formed in its interior.

The first alignment structure 740 includes a rectangular opening having a longitudinal axis (dashed line with end arrows) aligned with and parallel to at least one element in the arrangement of first feature elements 710. The second alignment structure 750 includes a rectangular opening having a longitudinal axis (dashed line with end arrows) aligned with and parallel to at least one element in the arrangement of second feature elements 720. The first and second alignment marks (740, 750) may be identifiable by their size and location in the region of photo-sensitive material 735, i.e., the first alignment structure 740 is smaller and located on the left-hand side of the region of photo-sensitive material 735 and the second alignment structure 750 is larger and located on the right-hand side of the region of photo-sensitive material 735.

Figure 6C:
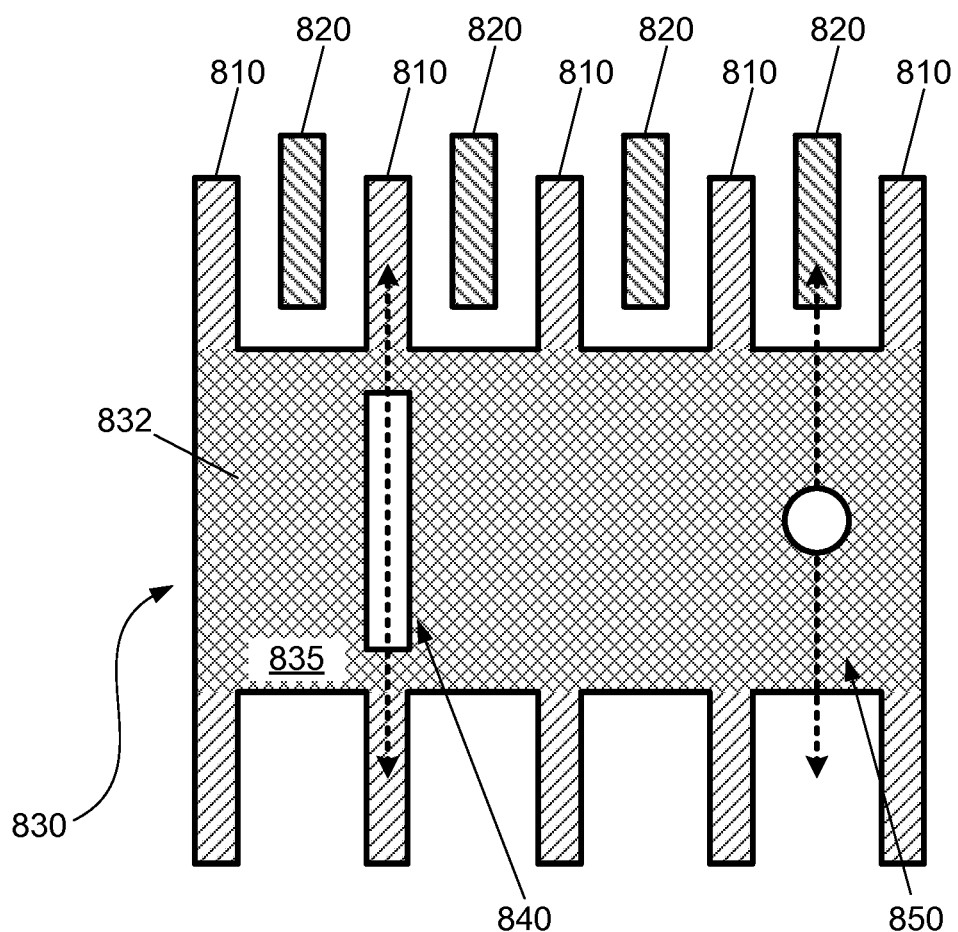

As shown in FIG. 6C, a double pattern is provided including an arrangement of first feature elements 810, an arrangement of second feature elements 820, and an inspection alignment mark 830. The inspection alignment mark 830 comprises a negative tone pattern characterized by a region of photo-sensitive material 835 (cross-hatched area), remaining after the formation of the double pattern, that has a first alignment structure 840 and a second alignment structure 850 formed in its interior.

The first alignment structure 840 includes a rectangular opening having a longitudinal axis (dashed line with end arrows) aligned with and parallel to at least one element in the arrangement of first feature elements 810. The second alignment structure 850 includes a circular opening having an axis (dashed line with end arrows) aligned with and parallel to at least one element in the arrangement of second feature elements 820. The first and second alignment marks (840, 850) may be identifiable by their shape and location in the region of photo-sensitive material 835, i.e., the first alignment structure 840 is rectangular and located on the left-hand side of the region of photo-sensitive material 835 and the second alignment structure 850 is circular and located on the right-hand side of the region of photo-sensitive material 835.

The shape of any opening in the inspection alignment mark may be arbitrary and may be selected for optimal printability. For example, the opening may include a circular shaped feature, an ovular shaped feature, a square shaped feature, or a rectangular shaped feature.

Figure 6D:
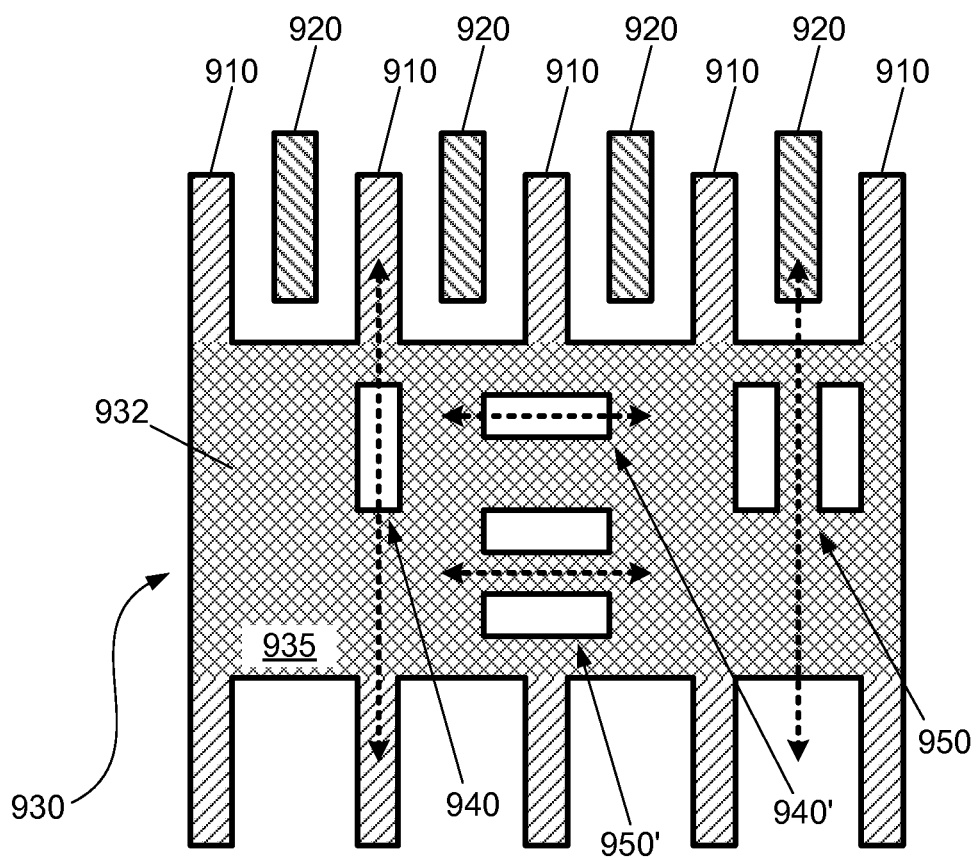

As shown in FIG. 6D, a double pattern is provided including an arrangement of first feature elements 910, an arrangement of second feature elements 920, and an inspection alignment mark 930. The inspection alignment mark 930 comprises a negative tone pattern characterized by a region of photo-sensitive material 935 (cross-hatched area), remaining after the formation of the double pattern, that has a first set of alignment structures (940, 950) for aligning with a first multi-pattern of a first orientation (i.e., vertical orientation in the illustration), and a second set of alignment structures (940', 950') for aligning with a second multi-pattern of a second orientation (i.e., horizontal orientation in the illustration).

The first set of alignment structures includes a first alignment structure 940 and a second alignment structure 950 formed within the interior of the region of photo-sensitive material 935. The first alignment structure 940 includes a rectangular opening having a longitudinal axis (dashed line with end arrows) aligned with and parallel to at least one element in the arrangement of first feature elements 910 (the arrangement of first feature elements 910 have a vertical orientation in the illustration). The second alignment structure 950 includes a pair of rectangular openings, each defining a bridge of photo-sensitive material extending there between and having a longitudinal axis (dashed line with end arrows) aligned with and parallel to at least one element in the arrangement of second feature elements 920 (the arrangement of second feature elements 920 have a vertical orientation in the illustration). The first and second alignment marks 940, 950 may be identifiable by their number, orientation, and location in the region of photo-sensitive material 935, i.e., the first alignment structure 940 includes one opening which is located on the left-hand side of the region of photo-sensitive material 935, and oriented vertically and the second alignment structure 950 includes two openings which are located on the right-hand side of the region of photo-sensitive material 935, and oriented vertically.

The second set of alignment structures includes a first alignment structure 940' and a second alignment structure 950' formed within the interior of the region of photo-sensitive material 935. The first alignment structure 940' includes a rectangular opening having a longitudinal axis (dashed line with end arrows) aligned with and parallel to at least one element in another arrangement of feature elements (not shown; however, these feature elements may have a horizontal orientation). The second alignment structure 950' includes a pair of rectangular openings, each defining a bridge of photo-sensitive material extending there between and having a longitudinal axis (dashed line with end arrows) aligned with and parallel to at least one element in yet another arrangement of feature elements (not shown; however, these feature elements may have a horizontal orientation). The first and second alignment marks 940', 950' may be identifiable by their number, orientation, and location in the region of photo-sensitive material 935, i.e., the first alignment structure 940' includes one opening which is located at the top of the region of photo-sensitive material 935, and oriented horizontally and the second alignment structure 950' includes two openings which are located at the bottom of the region of photo-sensitive material 935, and oriented vertically.

Although only certain embodiments of this invention have been described in detail above, those skilled in the art will readily appreciate that many modifications are possible in the embodiments without materially departing from the novel teachings and advantages of this invention. For example, although one exemplary process flow is provided for preparing a metal gate structure, other process flows are contemplated. Accordingly, all such modifications are intended to be included within the scope of this invention.

The invention claimed is:

1. A method for image pattern recognition in a multi-image patterning scheme, comprising:
   forming a first feature pattern on a substrate using a lithographic process;
   forming a second feature pattern on said substrate using said lithographic process; and forming an inspection alignment mark on said substrate to distinguish said first feature pattern from said second feature pattern, said inspection alignment mark comprising a negative tone pattern having a first alignment structure aligned with at least a portion of said first feature pattern and a second alignment structure aligned with at least a portion of said second feature pattern, said first alignment structure independent from said second alignment structure, wherein said forming said inspection alignment mark on said substrate comprises preparing a region of photo-sensitive material with one or more first openings arranged in an interior of said region of photo-sensitive material to serve as said first alignment structure and one or more second openings arranged in said interior of said region of photo-sensitive material to serve as said second alignment structure, said one or more first openings and said one or more second openings being identifiable from one another.

2. The method of claim 1, further comprising:
inspecting said first alignment structure, said first feature pattern, said second alignment structure, and said second feature pattern using a scanning electron microscope (SEM).

3. The method of claim 1, further comprising:
identifying said first feature pattern using said first alignment structure in said inspection alignment mark;
assessing the pattern integrity of said first feature pattern;
identifying said second feature pattern using said second alignment structure in said inspection alignment mark; and
assessing the pattern integrity of said second feature pattern.

4. The method of claim 1, wherein said lithographic process comprises:
forming a first layer of said photo-sensitive material on a substrate;
imaging said first layer of photo-sensitive material with a first image pattern;
developing said first layer of photo-sensitive material to form said first feature pattern and said inspection alignment mark;
applying a chemical freeze layer over said first layer of photo-sensitive material and reacting said chemical freeze layer with an exposed surface of said first layer of photo-sensitive material;
stripping said chemical freeze layer;
forming a second layer of said photo-sensitive material on the substrate;
imaging said second layer of photo-sensitive material with a second image pattern;
developing said second layer of photo-sensitive material to form said second feature pattern; and
transferring said first feature pattern, said second feature pattern, and said inspection alignment mark to an underlying layer using an etching process.

5. The method of claim 1, wherein said lithographic process comprises:
forming a first layer of said photo-sensitive material on a substrate;
imaging said first layer of photo-sensitive material with a first image pattern;
developing said first layer of photo-sensitive material to form said first feature pattern;
applying a chemical freeze layer over said first layer of photo-sensitive material and reacting said chemical freeze layer with an exposed surface of said first layer of photo-sensitive material;
stripping said chemical freeze layer;
forming a second layer of said photo-sensitive material on said substrate;
imaging said second layer of photo-sensitive material with a second image pattern;
developing said second layer of photo-sensitive material to form said second feature pattern and said inspection alignment mark; and
transferring said first feature pattern, said second feature pattern, and said inspection alignment mark to an underlying layer using an etching process.

6. The method of claim 1, wherein said lithographic process comprises:
forming a layer of said photo-sensitive material on a substrate;
imaging said layer of photo-sensitive material with a first image pattern;
imaging said layer of photo-sensitive material with a second image pattern;
developing said layer of photo-sensitive material to form said first feature pattern, said second feature pattern, and said inspection alignment mark; and
transferring said first feature pattern, said second feature pattern, and said inspection alignment mark to an underlying layer using an etching process.

7. The method of claim 1, wherein said lithographic process comprises:
forming a first layer of said photo-sensitive material on a substrate;
imaging said first layer of photo-sensitive material with a first image pattern;
developing said first layer of photo-sensitive material to form said first feature pattern and said inspection alignment mark;
transferring said first feature pattern and said inspection alignment mark to an underlying layer using a first etching process;
removing said first layer of photo-sensitive material;
forming a second layer of said photo-sensitive material on said substrate;
imaging said second layer of photo-sensitive material with a second image pattern;
developing said second layer of photo-sensitive material to form said second feature pattern; and
transferring said second feature pattern to said underlying layer using a second etching process.

8. The method of claim 1, wherein said lithographic process comprises:
forming a first layer of said photo-sensitive material on a substrate;
imaging said first layer of photo-sensitive material with a first image pattern;
developing said first layer of photo-sensitive material to form said first feature pattern;
transferring said first feature pattern to an underlying layer using a first etching process;
removing said first layer of photo-sensitive material;
forming a second layer of said photo-sensitive material on said substrate;
imaging said second layer of photo-sensitive material with a second image pattern;

developing said second layer of photo-sensitive material to form said second feature pattern and said inspection alignment mark; and transferring said second feature pattern and said inspection alignment mark to said underlying layer using a second etching process.

9. The method of claim 1, further comprising:

transferring said first feature pattern, said second feature pattern, and said inspection alignment mark in a first layer on said substrate to a second layer underlying said first layer using an etching process; and using said inspection alignment mark transferred to said second layer to distinguish between said first feature pattern and said second feature pattern in said second layer.

10. The method of claim 1, further comprising:

providing one or more additional alignment structures in said inspection alignment mark to align with and identify one or more additional feature patterns on said substrate.

11. The method of claim 1, wherein said first feature pattern comprises a first line pattern and said second feature pattern comprises a second line pattern, said first line pattern interlaced with said second line pattern.

12. The method of claim 1, wherein said one or more first openings comprises a single opening, and wherein said one or more second openings comprises a pair of openings, the openings in said pair of openings being separated by a bridge of photo-sensitive material extending there between.

13. The method of claim 12, wherein said single opening is spaced apart from said pair of openings by a distance greater than the spacing between the openings in said pair of openings.

14. The method of claim 12, wherein said single opening aligns with and identifies at least a portion of said first feature pattern.

15. The method of claim 12, wherein each of the openings in said pair of openings aligns with and identifies at least a portion of said second feature pattern, or said bridge of photo-sensitive material extending between the openings in said pair of openings aligns with and identifies at least a portion of said second feature pattern.

16. The method of claim 1, wherein at least one opening in said one or more first openings and said one or more second openings comprises a circular shaped feature, an ovular shaped feature, a square shaped feature, or a rectangular shaped feature.

17. The method of claim 1, wherein said one or more first openings comprises a first opening and said one or more second openings comprises a second opening, said second opening being shaped differently than said first opening.

18. A method for image pattern recognition in a multi-image patterning scheme, comprising:

forming a first feature pattern on a substrate using a lithographic process;

forming a second feature pattern on said substrate using said lithographic process; and forming an inspection alignment mark on said substrate to distinguish said first feature pattern from said second feature pattern, said inspection alignment mark comprising a negative tone pattern having a first alignment structure aligned with at least a portion of said first feature pattern and a second alignment structure aligned with at least a portion of said second feature pattern, said first alignment structure independent from said second alignment structure, wherein said lithographic process comprises:

forming a first layer of photo-sensitive material on a substrate;

imaging said first layer of photo-sensitive material with a first image pattern;

developing said first layer of photo-sensitive material to form said first feature pattern and said inspection alignment mark;

applying a chemical freeze layer over said first layer of photo-sensitive material and reacting said chemical freeze layer with an exposed surface of said first layer of photo-sensitive material;

stripping said chemical freeze layer;

forming a second layer of photo-sensitive material on the substrate;

imaging said second layer of photo-sensitive material with a second image pattern;

developing said second layer of photo-sensitive material to form said second feature pattern; and transferring said first feature pattern, said second feature pattern, and said inspection alignment mark to an underlying layer using an etching process.

19. A method for image pattern recognition in a multi-image patterning scheme, comprising:

forming a first feature pattern on a substrate using a lithographic process;

forming a second feature pattern on said substrate using said lithographic process; and forming an inspection alignment mark on said substrate to distinguish said first feature pattern from said second feature pattern, said inspection alignment mark comprising a negative tone pattern having a first alignment structure aligned with at least a portion of said first feature pattern and a second alignment structure aligned with at least a portion of said second feature pattern, said first alignment structure independent from said second alignment structure, wherein said lithographic process comprises:

forming a first layer of photo-sensitive material on a substrate;

imaging said first layer of photo-sensitive material with a first image pattern;

developing said first layer of photo-sensitive material to form said first feature pattern;

applying a chemical freeze layer over said first layer of photo-sensitive material and reacting said chemical freeze layer with an exposed surface of said first layer of photo-sensitive material;

stripping said chemical freeze layer;

forming a second layer of photo-sensitive material on said substrate;

imaging said second layer of photo-sensitive material with a second image pattern;

developing said second layer of photo-sensitive material to form said second feature pattern and said inspection alignment mark; and transferring said first feature pattern, said second feature pattern, and said inspection alignment mark to an underlying layer using an etching process.

* * * * *